United States Patent
Fu et al.

(10) Patent No.: US 10,074,316 B2
(45) Date of Patent: Sep. 11, 2018

(54) OLED DISPLAY AND SOURCE DRIVER

(71) Applicant: Shenzhen China Star Optoelectronics Technology Co., Ltd., Shenzhen (CN)

(72) Inventors: Jianhang Fu, Shenzhen (CN); Taijiun Hwang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 297 days.

(21) Appl. No.: 14/913,375

(22) PCT Filed: Jan. 29, 2016

(86) PCT No.: PCT/CN2016/072843
§ 371 (c)(1),
(2) Date: Feb. 22, 2016

(87) PCT Pub. No.: WO2017/107290
PCT Pub. Date: Jun. 29, 2017

(65) Prior Publication Data
US 2018/0033376 A1 Feb. 1, 2018

(30) Foreign Application Priority Data
Dec. 22, 2015 (CN) .......................... 2015 1 0975836

(51) Int. Cl.
*G09G 3/3291* (2016.01)
*H01L 51/52* (2006.01)
(Continued)

(52) U.S. Cl.
CPC .......... *G09G 3/3291* (2013.01); *G09G 3/3225* (2013.01); *H01L 27/3262* (2013.01); *H01L 51/5203* (2013.01)

(58) Field of Classification Search
CPC .......... G09G 3/20; G09G 3/22; G09G 3/3208; G09G 3/3233; G09G 3/3406;
(Continued)

(56) References Cited

U.S. PATENT DOCUMENTS

2004/0125067 A1* 7/2004 Kim ...................... G09G 3/3614
345/98
2008/0180589 A1* 7/2008 Woo ...................... G09G 3/3614
349/38
(Continued)

FOREIGN PATENT DOCUMENTS

CN 103855192 A 6/2014

*Primary Examiner* — Hong Zhou
(74) *Attorney, Agent, or Firm* — Leong C. Lei (57) ABSTRACT

The invention provides an OLED display and a source driver. The output channels of source driver are divided into odd-numbered (ODD) and even-numbered (EVEN) output channels. With the odd-even channel selection module (33) in source driver to control the logic circuit and driver module (31) to select only odd-numbered (ODD), only even-numbered (EVEN) output channels or both for output based on strobe enabling signal (EN) and odd-even selection signal (SEL). Moreover, through rapid switching between high and low of the odd-even selection signal (SEL), the switching of outputting to only odd-numbered (ODD) and only even-numbered (EVEN) output channels is achieved so that odd-numbered pixel units and even-numbered pixel units in OLED display emit light alternatingly. Without changing pixel structure and reducing opening ration, while ensuring normal display, the invention shortens the light-emitting time of OLED inside each pixel to delay OLED display ageing.

9 Claims, 9 Drawing Sheets (51) Int. Cl.
*H01L 27/32* (2006.01)
*G09G 3/3225* (2016.01)

(58) Field of Classification Search
CPC .............. G09G 3/3607; G09G 3/3225; G09G
2300/0452; G09G 2310/0224; G09G
2320/043; G09G 2320/045; G09G
3/3614; G09G 3/3688; G09G 3/3291;
H01L 51/5203; H01L 27/3262
See application file for complete search history.

(56) References Cited

U.S. PATENT DOCUMENTS

| | | | |
|---|---|---|---|
| 2010/0164913 A1* | 7/2010 | Lin | G09G 3/3688 |
| | | | 345/205 |
| 2011/0057919 A1* | 3/2011 | Kim | G09G 3/3233 |
| | | | 345/211 |
| 2013/0088479 A1* | 4/2013 | Kim | G09G 3/3614 |
| | | | 345/212 |
| 2014/0184583 A1* | 7/2014 | Wyatt | G09G 3/3614 |
| | | | 345/214 |
| 2015/0187308 A1* | 7/2015 | Shin | G09G 3/3614 |
| | | | 345/209 |
| 2015/0339972 A1* | 11/2015 | Xu | G09G 3/3225 |
| | | | 345/206 |

\* cited by examiner

OLED DISPLAY AND SOURCE DRIVER

BACKGROUND OF THE INVENTION

1. Field of the Invention

The present invention relates to the field of display, and in particular to an organic light emitting diode (OLED) display and a source driver.

2. The Related Arts

The organic light-emitting diode (OLED) display has the advantages of active light-emitting, low driving voltage, high light-emitting efficiency, short response time, high clarity and high contrast, near 180°, wide operation temperature range, and the ability to realize flexible display and large-size full-color display, and is often considered as the technology with most potential.

The OLED usually comprises: an anode, an organic light-emitting layer disposed at the anode, an electron transmission layer disposed at the organic light-emitting layer, and a cathode disposed at the electron transmission layer. The known OLED is mostly driven by direct current (DC), and emitting the hole from the anode and electron from the cathode to the organic light-emitting layer when operating. The electrons and holes combination generates the excited electron-hole pair, and transform the excited electron-hole pair from the excited state to the basic state to emit light.

Figure 1:
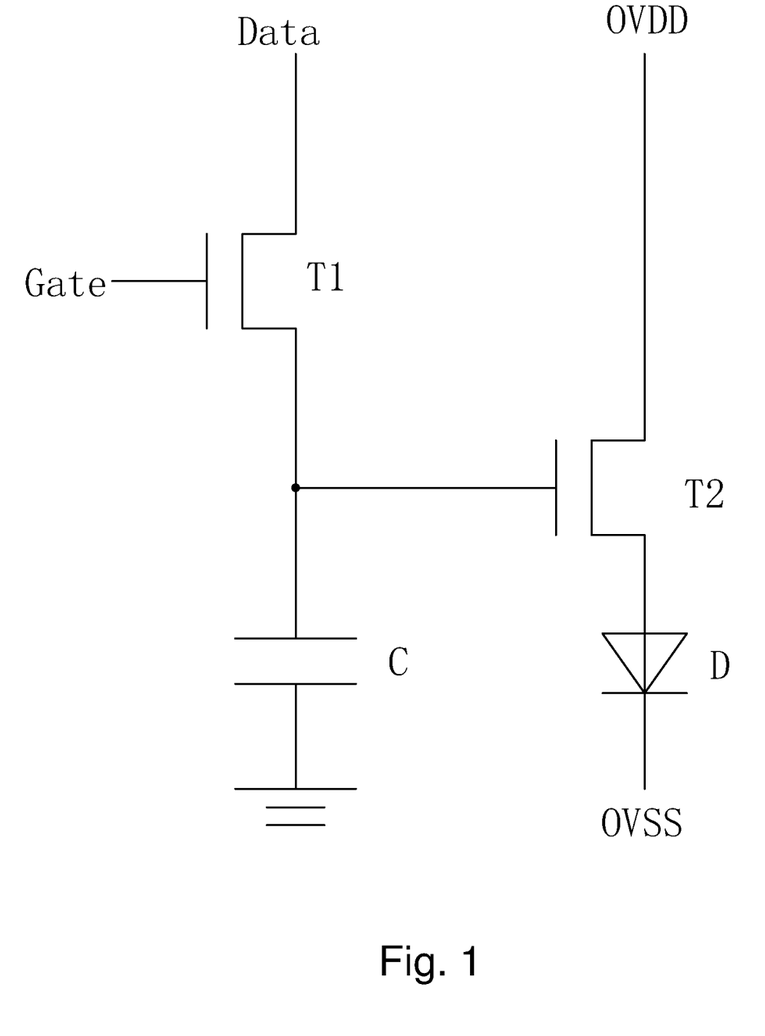
FIG. 1 is a schematic view showing a known 2T1C pixel driver for OLED display.

FIG. 1 shows a pixel driver commonly used for a known OLED display, which comprises: a first thin film transistor (TFT) T1, a second TFT T2, and a capacitor C, i.e., 2T1C pixel driver; the first TFT T1 has the gate connected to a scan signal Gate, the drain connected to a data signal Data, and the source connected to the gate of the second TFT T2 and one end of the capacitor C; the second TFT T2 has the drain connected to positive power source OVDD, and the source connected to the anode of the OLED D; the cathode of OLED D is connected to the negative power source OVSS; the other end of the capacitor C is grounded. When the gate driver provides the scan signal Gate to the pixel, the source driver provides the data signal Date to charge the capacitor C. The voltage of the capacitor C is used as the gate voltage for the second TFT T2 to control the current flowing through the OLED. Usually, when the OLED display employing the above pixel driver operates, all the pixels keep emitting light. As the usage time increase, the hole and the electrons accumulate the respective interface between transmission layer and the light-emitting layer to form built-in electric field inside the OLED and increase the threshold voltage of the OLED to reduce the luminance.

Figure 2:
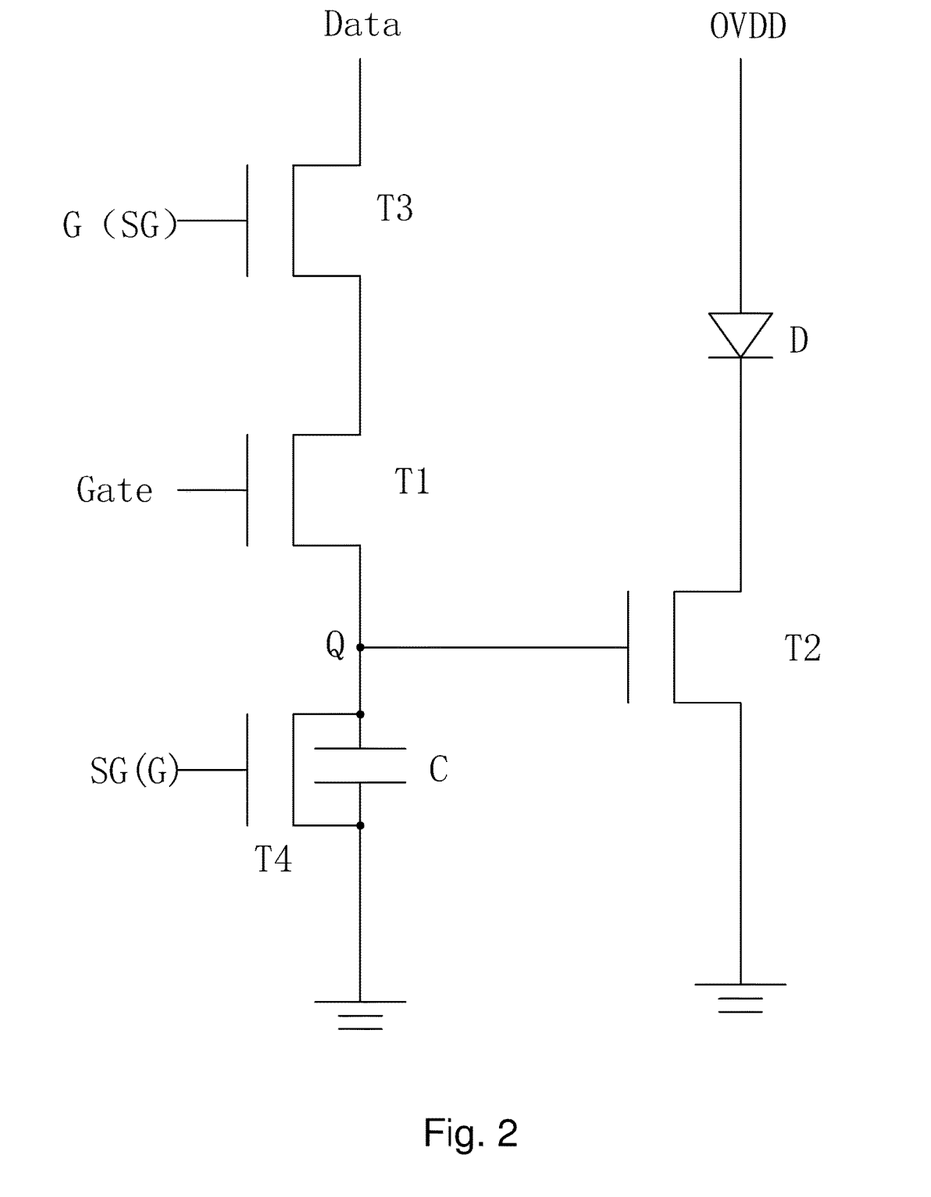
FIG. 2 is a schematic view showing the improved pixel driver based on the pixel driver in FIG. 1.
Figure 3:
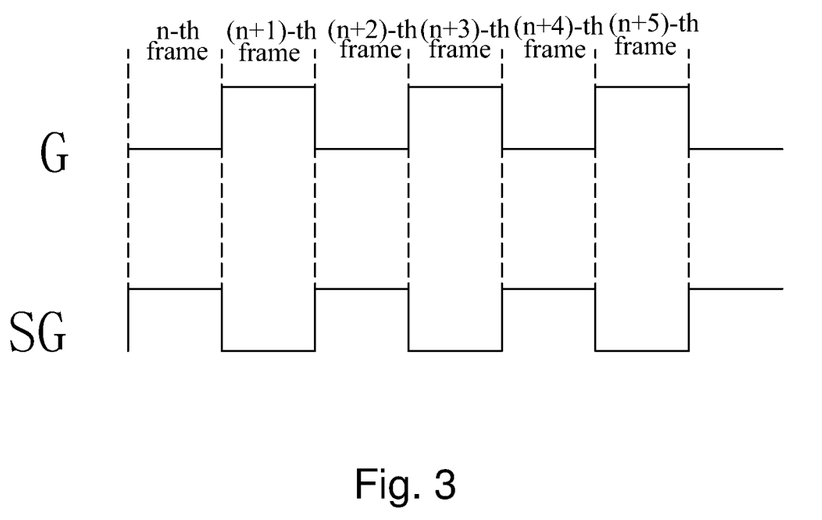
FIG. 3 is a schematic view showing the first light-emitting control signal and the second light-emitting control signal of the pixel driver in FIG. 2.

To solve the above problem, the known technology improves the above pixel driver. Refer to FIG. 2, the improved the pixel driver comprises: a first TFT T1, a second TFT T2, a third TFT T3, a fourth TFT T4 and a capacitor C. The first TFT T1 has the gate connected to the scan signal Gate, the drain connected to the source of third TFT T3, the source connected to the first node Q; the second TFT T2 has the gate connected to the first node Q, the drain connected to the cathode of OLED D, the source grounded; the third TFT T3 has the gate connected to one of the first light-emitting control signal G and the second light-emitting control signal SG, the drain connected to the data signal Data; the fourth TFT T4 has the gate connected to the other one of the first light-emitting control signal G and the second light-emitting control signal SG, the drain connected to the first node Q; the source grounded; the capacitor has one end connected to the first node Q, and the other grounded. For the pixel using the above pixel driver, when the gate of third TFT T3 of the pixel driver for one of the pixels is connected to the first light-emitting control signal G and the gate of fourth TFT T4 is connected to the second light-emitting control signal SG, the pixel drivers for the four adjacent pixels (above, below, left and right) have the gates of third TFTs T3 connected to the second light-emitting control signal SG, and the gate of fourth TFT T4 is connected to the first light-emitting control signal G. Refer to FIG. 3, the first light-emitting control signal G switches constantly between the high and low levels with a period of a frame, and the second light-emitting control signal SG is the inverted signal for the first light-emitting control signal G. Through the improved pixel driver, the adjacent pixels emit light alternatingly to shorten the light-emitting time to reduce the ageing of OLED display. However, the above improvement adds two TFTs, which leads to a smaller opening ratio of the OLED display, as well as two control signals, which increases the cost for the driver system.

SUMMARY OF THE INVENTION

The object of the present invention is to provide an OLED display, without changing the pixel structure and reducing the opening ratio, while ensuring normal display to shorten the light-emitting time for the OLED inside the pixel and slow down the ageing of the OLED display.

Another object of the present invention is to provide a source driver, able to select different output channel to output data signal depending on the requirements so that different pixels in OLED display can display alternatingly to shorten the light-emitting time for OLED inside each pixel and slow down the ageing of the OLED display.

To achieve the above object, the present invention provides an OLED display, which comprises: a timing controller, a gate driver connected to the timing controller, a source driver connected to the timing controller, and an OLED panel connected to the gate driver and the source driver; the source driver comprising: a logic circuit and driver module, a data receiving module connected to the logic circuit and driver module, an even-odd channel selection module connected to the logic circuit and driver module, a plurality of odd-numbered output channels connected to the logic circuit and driver module, and a plurality of even-numbered output channels connected to the logic circuit and driver module; the OLED panel comprising a plurality of pixel units arranged in an array form, the pixel units divided into odd-numbered pixel units and even-numbered pixel units, the odd-numbered pixel units connected through corresponding data lines to the odd-numbered output channels, and the even-numbered pixel units connected through corresponding data lines to the even-numbered output channels; the timing controller providing a strobe enabling signal and an odd-even selection signal, the odd-even channel selection module controlling the logic circuit and driver module to select strobe only odd-numbered output channels, strobe only even-numbered output channels, or strobe both odd-numbered and even-numbered output channels.

The gate driver comprises a plurality of scan signal output channels, with each scan signal output channel connected through a scan line to a corresponding column of pixel units.

Optionally, the adjacent pixel units in all four direction (i.e., above, below, left and right) to each odd-number pixel unit are all even-numbered pixel units.

The odd-numbered pixel units of the same row of pixel units are connected through a data line disposed at a side of the row of pixel units to an odd-number output channel; the even-numbered pixel units of the same row of pixel units are connected through a data line disposed at the other side of the row of pixel units to an even-number output channel.

Optionally, the pixel units of an odd-numbered row of pixel units are all odd-numbered pixel units, the pixel units of an even-numbered row of pixel units are all even-numbered pixel units, each pixel unit of odd-numbered row is connected through a data line to an odd-number output channel, and each pixel unit of even-numbered row is connected through a data line to an even-number output channel.

The odd-even selection signal switches between a high level and a low level, with the switching period of one frame.

When the strobe enabling signal is at high level, the odd-even selection signal is at low level, only the odd-numbered output channels are strobed, and the even-numbered output channels output 0 grayscale voltage; when the strobe enabling signal is at high level, the odd-even selection signal is at high level, only the even-numbered output channels are strobed, and the odd-numbered output channels output 0 grayscale voltage; and when the strobe enabling signal is at low level, both the odd-numbered output channels and the even-numbered output channels are strobed.

The data receiving module receives data signals and provides to the logic circuit and driver module, the logic circuit and driver module provides the data signals to the corresponding pixel units in accordance with the controlling of the strobe output channels by the odd-even selection module.

The present invention also provides a source driver, which comprises: a logic circuit and driver module, a data receiving module connected to the logic circuit and driver module, an even-odd channel selection module connected to the logic circuit and driver module, a plurality of odd-numbered output channels connected to the logic circuit and driver module, and a plurality of even-numbered output channels connected to the logic circuit and driver module; the odd-even channel selection module receiving a strobe enabling signal and an odd-even selection signal, the odd-even channel selection module controlling the logic circuit and driver module to select strobe only odd-numbered output channels, strobe only even-numbered output channels, or strobe both odd-numbered and even-numbered output channels.

The odd-even selection signal switches between a high level and a low level, with the switching period of one frame.

When the strobe enabling signal is at high level, the odd-even selection signal is at low level, only the odd-numbered output channels are strobed, and the even-numbered output channels output 0 grayscale voltage; when the strobe enabling signal is at high level, the odd-even selection signal is at high level, only the even-numbered output channels are strobed, and the odd-numbered output channels output 0 grayscale voltage; and when the strobe enabling signal is at low level, both the odd-numbered output channels and the even-numbered output channels are strobed.

The present invention also provides an OLED display, which comprises: a timing controller, a gate driver connected to the timing controller, a source driver connected to the timing controller, and an OLED panel connected to the gate driver and the source driver; the source driver comprising: a logic circuit and driver module, a data receiving module connected to the logic circuit and driver module, an even-odd channel selection module connected to the logic circuit and driver module, a plurality of odd-numbered output channels connected to the logic circuit and driver module, and a plurality of even-numbered output channels connected to the logic circuit and driver module; the OLED panel comprising a plurality of pixel units arranged in an array form, the pixel units divided into odd-numbered pixel units and even-numbered pixel units, the odd-numbered pixel units connected through corresponding data lines to the odd-numbered output channels, and the even-numbered pixel units connected through corresponding data lines to the even-numbered output channels; the timing controller providing a strobe enabling signal and an odd-even selection signal, the odd-even channel selection module controlling the logic circuit and driver module to select strobe only odd-numbered output channels, strobe only even-numbered output channels, or strobe both odd-numbered and even-numbered output channels; wherein the gate driver comprising a plurality of scan signal output channels, with each scan; signal output channel connected through a scan line to a corresponding column of pixel units; wherein the odd-even selection signal switches between a high level and a low level, with the switching period of one frame; wherein the data receiving module receives data signals and provides to the logic circuit and driver module, the logic circuit and driver module provides the data signals to the corresponding pixel units in accordance with the controlling of the strobe output channels by the odd-even selection module.

Compared to the known techniques, the present invention provides the following advantages: the present invention provides an OLED display and a source driver. The output channels of source driver are divided into odd-numbered and even-numbered output channels. With the odd-even channel selection module in source driver to control the logic circuit and driver module to select only odd-numbered, only even-numbered output channels or both for output based on a strobe enabling signal and an odd-even selection signal. Moreover, through rapid switching between high and low of the odd-even selection signal, the switching of outputting to only odd-numbered and only even-numbered output channels is achieved so that odd-numbered pixel units and even-numbered pixel units in OLED display emit light alternatingly. Without changing pixel structure and reducing opening ration, while ensuring normal display, the invention shortens the light-emitting time of OLED inside each pixel to delay OLED display ageing.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 4:
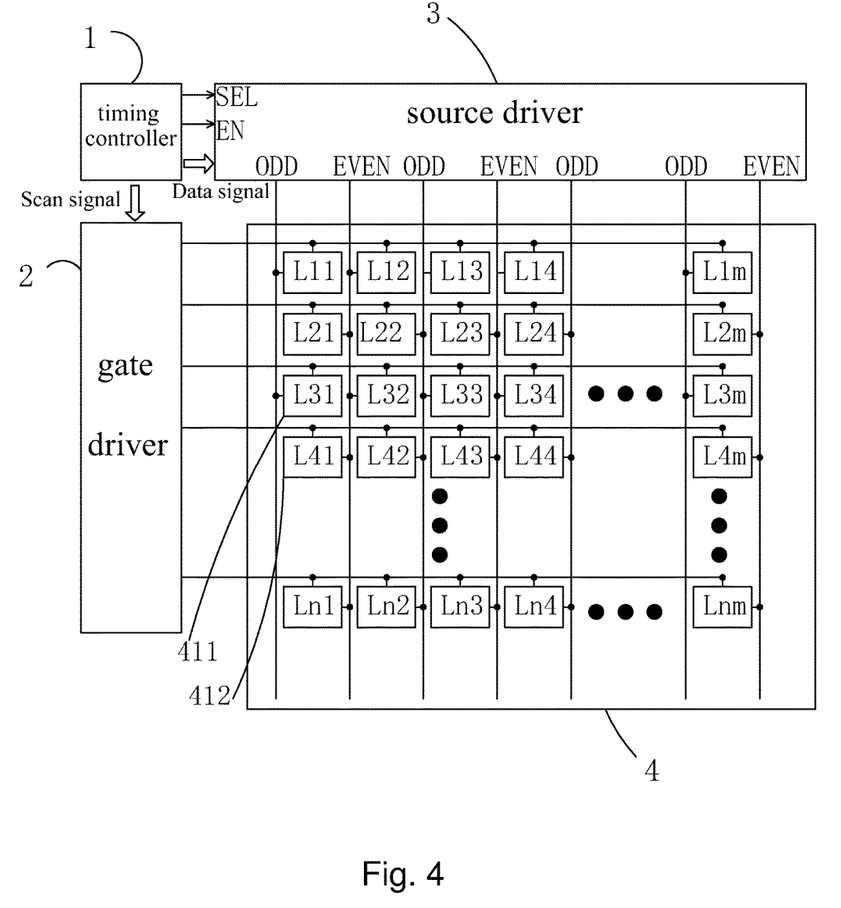
FIGS. 4 is a schematic view showing the first embodiment of an OLED display provided by an embodiment of the present invention.
Figure 5:
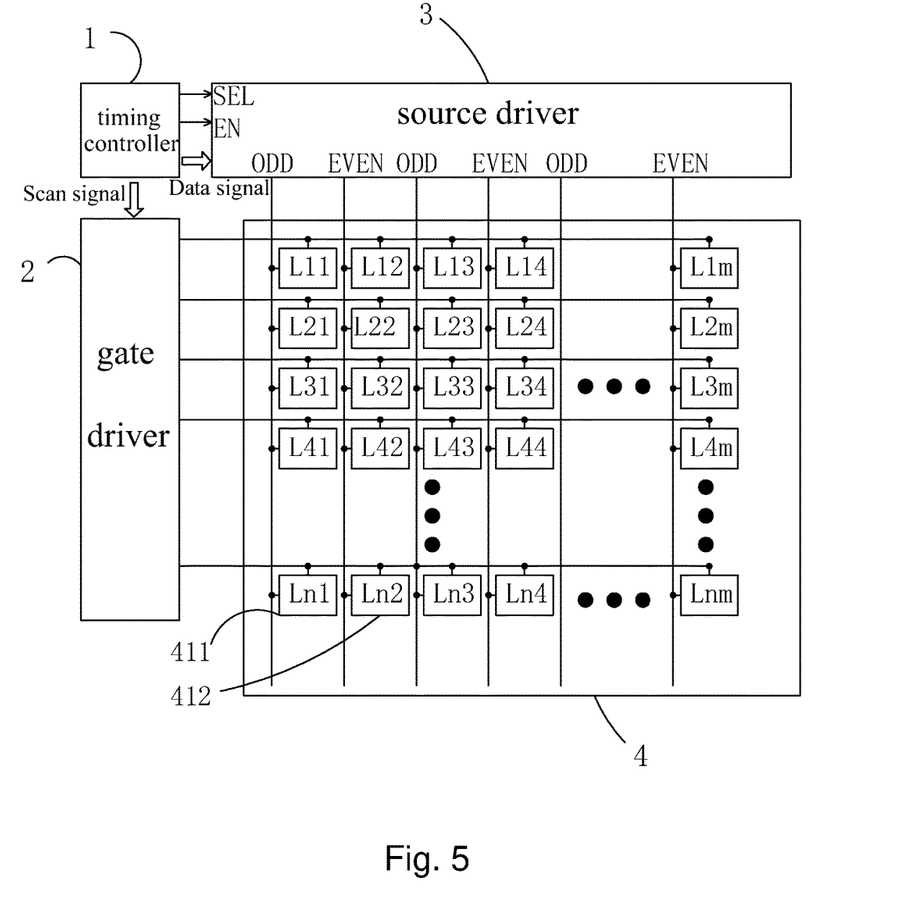
FIG. 5 is a schematic view showing the first embodiment of an OLED display provided by an embodiment of the present invention.

Refer to FIG. 4 and FIG. 5. The present invention provides an OLED display, which comprises: a timing controller 1, a gate driver 2 connected to the timing controller 1, a source driver 3 connected to the timing controller 1, and an OLED panel 4 connected to the gate driver 2 and the source driver 3.

Figure 6:
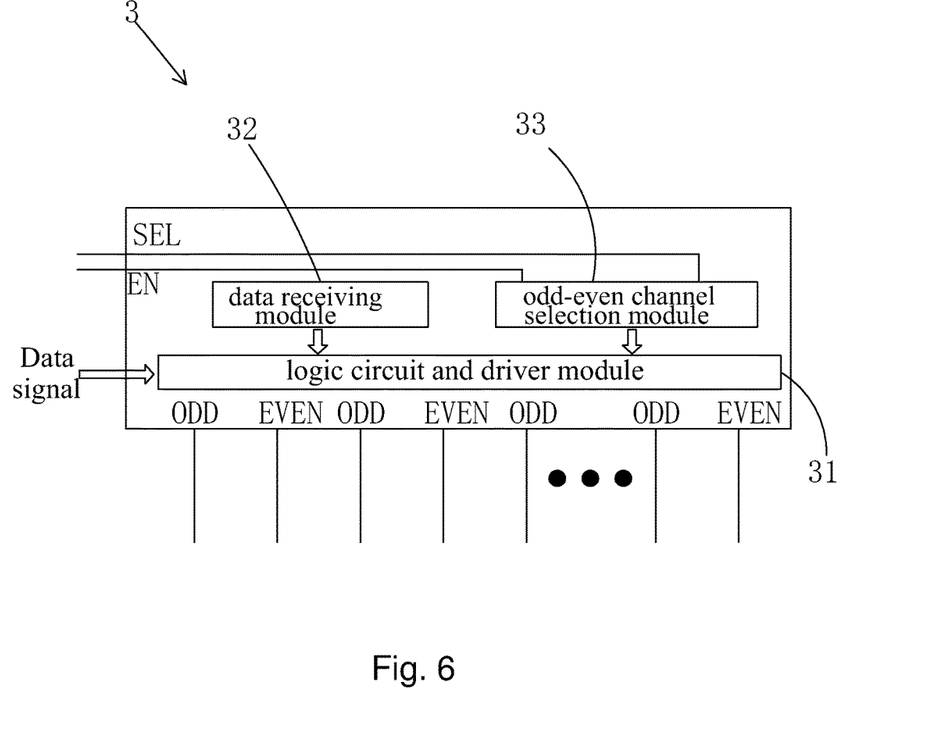
FIG. 6 is a schematic view showing the second embodiment of an OLED display provided by an embodiment of the present invention.

As shown in FIG. 6, the source driver 3 comprises: a logic circuit and driver module 31, a data receiving module 32 connected to the logic circuit and driver module 31, an even-odd channel selection module 33 connected to the logic circuit and driver module 31, a plurality of odd-numbered output channels ODD connected to the logic circuit and driver module 31, and a plurality of even-numbered output channels EVEN connected to the logic circuit and driver module 31.

Specifically, the odd-numbered output channels ODD and the even-numbered output channels EVEN output alternatingly, and the number of the odd-numbered output channels ODD and the numbers of the even-numbered output channels EVEN are the same. The data receiving module 32 receives data signals and provides to the logic circuit and driver module 31.

The OLED panel 4 comprises a plurality of pixel units arranged in an array form, the pixel units are divided into odd-numbered pixel units 411 and even-numbered pixel units 412. The odd-numbered pixel units 411 are connected through corresponding data lines to the odd-numbered output channels ODD, and the even-numbered pixel units 412 are connected through corresponding data lines to the even-numbered output channels EVEN.

The gate driver 2 comprises a plurality of scan signal output channels, with each scan signal output channel connected through a scan line to a corresponding column of pixel units.

Optionally, referring to FIG. 4, in the first embodiment of the OLED display, the adjacent pixel units in all four direction (i.e., above, below, left and right) to each odd-number pixel unit 411 are all even-numbered pixel units 412. The odd-numbered pixel units 411 of the same row of pixel units are connected through a data line disposed at a side of the row of pixel units to an odd-number output channel ODD; the even-numbered pixel units 412 of the same row of pixel units are connected through a data line disposed at the other side of the row of pixel units to an even-number output channel EVEN.

Optionally, referring to FIG. 5, in the second embodiment of the OLED display, the pixel units of an odd-numbered row of pixel units are all odd-numbered pixel units 411, the pixel units of an even-numbered row of pixel units are all even-numbered pixel units 412, each pixel unit of odd-numbered row is connected through a data line to an odd-number output channel ODD, and each pixel unit of even-numbered row is connected through a data line to an even-number output channel EVEN.

Refer to FIGS. 4, 6, 7, or FIGS. 5, 6, 7. The timing controller 1 provides a strobe enabling signal EN and an odd-even selection signal SEL, the odd-even channel selection module 33 controls the logic circuit and driver module 31 to select strobe only odd-numbered output channels ODD, strobe only even-numbered output channels EVEN, or strobe both odd-numbered ODD and even-numbered EVEN output channels. The logic circuit and driver module 31 outputs data signals to corresponding pixel units in accordance with the output channels selected by the odd-even channel selection module 33.

Figure 7:
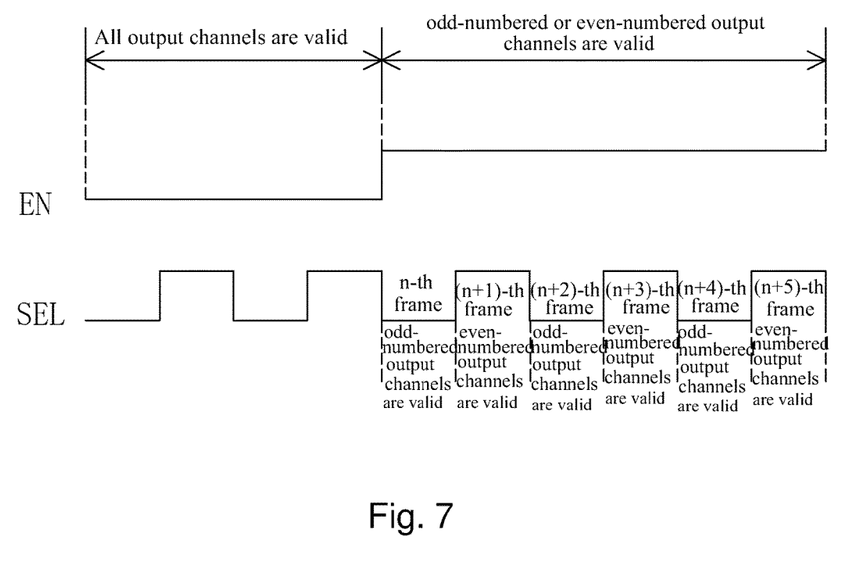
FIG. 7 is a schematic view showing the structure of the source driver and the driver in the OLED display provided by an embodiment of the present invention.

Specifically, the odd-even selection signal switches between a high level and a low level.

When the strobe enabling signal EN is at high level, the odd-even selection signal SEL is at low level, only the odd-numbered output channels ODD are strobed, and the even-numbered output channels EVEN output 0 grayscale voltage.

When the strobe enabling signal EN is at high level, the odd-even selection signal SEL is at high level, only the even-numbered output channels EVEN are strobed, and the odd-numbered output channels ODD output 0 grayscale voltage.

Figure 8:
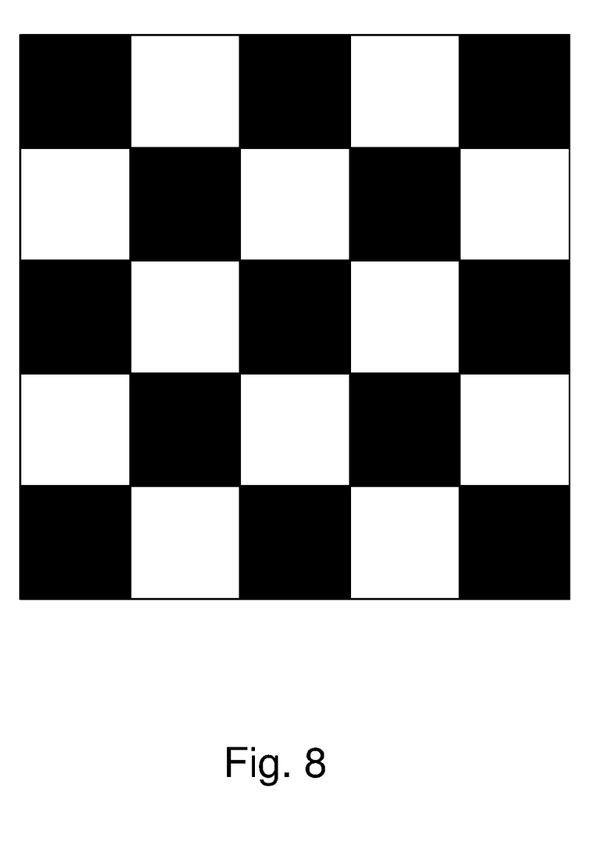
FIG. 8 is a schematic view showing the timing of the strobe enabling signal and the odd-even selection signal to control the source driver provided by an embodiment of the present invention.
Figure 9:
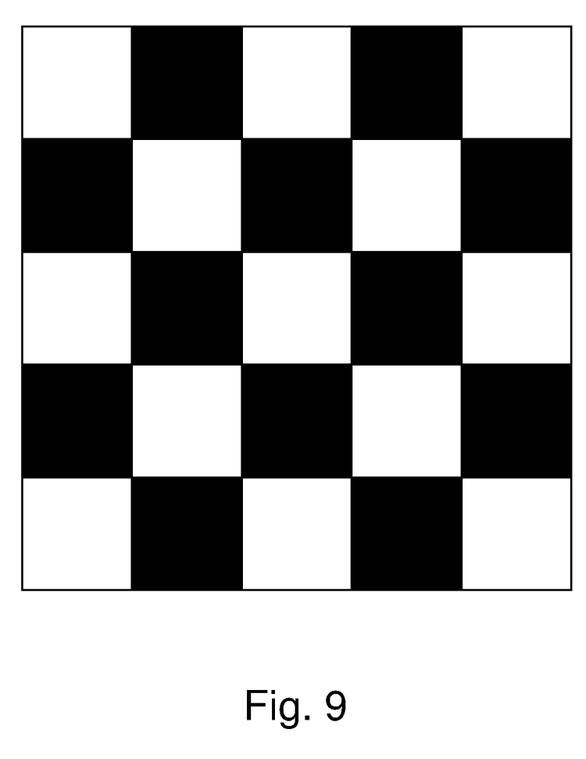
FIG. 9 is a schematic view showing the light emission by pixel units of the next frame for a frame provided by an embodiment of the present invention.

When the strobe enabling signal EN is at low level, because the odd-even selection signal SEL constantly switches between a high level and a low level to control the odd-even channel selection module 33 to strobe only the odd-numbered output channels ODD and only even-numbered output channels EVEN alternatingly, the odd-numbered pixel units 411 and the even-numbered pixel units 412 in the OLED display emit light alternatingly. The switching period of the odd-even selection signal SEL is preferably, but not limited to, a frame. Refer to FIG. 4, 6, 7 and also FIGS. 8, 9. The same pixel unit emits light only in one of the two adjacent frames, but not in the other frame. Therefore, the light-emitting time for the OLED in each pixel is shortened to half, as compared to the conventional technology. As such, the present invention delays the ageing of the OLED display. With the persistence of vision for human eyes, when the odd-even selection signal SEL switches rapidly enough, the OLED display appears to perform normal displaying without affecting the result.

Specifically, when the strobe enabling signal EN is at low level, both the odd-numbered output channels ODD and the even-numbered output channels EVEN are strobed, as the function performed in known source driver.

Moreover, the correspondence between the level of odd-even selection signal SEL and the strobed output channels is not limited as the above. In other embodiment, when the strobe enabling signal EN is at high level, the odd-even selection signal SEL is at high level, only the odd-numbered output channels ODD are strobed, and the even-numbered output channels EVEN output 0 grayscale voltage; and when the strobe enabling signal EN is at high level, the odd-even selection signal SEL is at low level, only the even-numbered output channels EVEN are strobed, and the odd-numbered output channels ODD output 0 grayscale voltage.

Specifically, the placement of the odd-number pixel units 411 and the even-numbered pixel units 412 is not limited to the above embodiment. For example, in the second embodiment of OLED display shown in FIG. 5, the pixel units of odd-numbered rows are all odd-numbered pixel units 411, and the pixel units of even-numbered rows are all even-numbered pixel units 412. Each pixel unit of odd-numbered row is connected through a data line to an odd-numbered output channel, and each pixel unit of even-numbered row is connected through a data line to an even-numbered output channel. In two adjacent frames, the pixel units of odd-numbered rows and the pixel units of even-numbered rows emit light alternatingly so as to shorten the light-emitting time of OLED and delay ageing of OLED display.

Refer to FIGS. 6 and 7. The present invention also provides a source driver, which comprises: a logic circuit and driver module 31, a data receiving module 32 connected to the logic circuit and driver module 31, an even-odd channel selection module 33 connected to the logic circuit and driver module 31, a plurality of odd-numbered output channels ODD connected to the logic circuit and driver module 31, and a plurality of even-numbered output channels EVEN connected to the logic circuit and driver module 31.

The odd-even channel selection module 33 receives a strobe enabling signal EN and an odd-even selection signal SEL. The odd-even channel selection module 33 controls the logic circuit and driver module 31 to select strobe only odd-numbered output channels ODD, strobe only even-numbered output channels EVEN, or strobe both odd-numbered ODD and even-numbered EVEN output channels.

Specifically, when the strobe enabling signal EN is at high level, the odd-even selection signal SEL is at low level, only the odd-numbered output channels ODD are strobed, and the even-numbered output channels EVEN output 0 grayscale voltage; when the strobe enabling signal EN is at high level, the odd-even selection signal SEL is at high level, only the even-numbered output channels EVEN are strobed, and the odd-numbered output channels ODD output 0 grayscale voltage. When the strobe enabling signal EN is at low level, because the odd-even selection signal SEL constantly switches between a high level and a low level to control the odd-even channel selection module 33 to strobe only the odd-numbered output channels ODD and only even-numbered output channels EVEN alternatingly.

Moreover, the correspondence between the level of odd-even selection signal SEL and the strobed output channels is not limited as the above. In other embodiment, when the strobe enabling signal EN is at high level, the odd-even selection signal SEL is at high level, only the odd-numbered output channels ODD are strobed, and the even-numbered output channels EVEN output 0 grayscale voltage; and when the strobe enabling signal EN is at high level, the odd-even selection signal SEL is at low level, only the even-numbered output channels EVEN are strobed, and the odd-numbered output channels ODD output 0 grayscale voltage.

Specifically, when the strobe enabling signal EN is at low level, both the odd-numbered output channels ODD and the even-numbered output channels EVEN are strobed, as the function performed in known source driver. As such, the source driver of the present invention not only performs the function of a conventional source driver, but also can select different output signals depending on requirements. By applying the source driver of the present invention to an OLED display, the odd-numbered pixel units and the even-numbered pixel units in the OLED display can emit light alternatingly. Without changing pixel structure and reducing opening ration, while ensuring normal display, the invention shortens the light-emitting time of OLED inside each pixel to delay OLED display ageing.

In summary, the present invention provides the present invention provides an OLED display and a source driver. The output channels of source driver are divided into odd-numbered and even-numbered output channels. With the odd-even channel selection module in source driver to control the logic circuit and driver module to select only odd-numbered, only even-numbered output channels or both for output based on a strobe enabling signal and an odd-even selection signal. Moreover, through rapid switching between high and low of the odd-even selection signal, the switching of outputting to only odd-numbered and only even-numbered output channels is achieved so that odd-numbered pixel units and even-numbered pixel units in OLED display emit light alternatingly. Without changing pixel structure and reducing opening ration, while ensuring normal display, the invention shortens the light-emitting time of OLED inside each pixel to delay OLED display ageing.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. An organic light-emitting diode (OLED) display, which comprises: a timing controller, a gate driver connected to the timing controller, a source driver connected to the timing controller, and an OLED panel connected to the gate driver and the source driver;

the source driver comprising: a logic circuit and driver module, a data receiving module connected to the logic circuit and driver module, an even-odd channel selection module connected to the logic circuit and driver module, a plurality of odd-numbered output channels connected to the logic circuit and driver module, and a plurality of even-numbered output channels connected to the logic circuit and driver module;

the OLED panel comprising a plurality of pixel units arranged in an array form, the pixel units divided into odd-numbered pixel units and even-numbered pixel units, the odd-numbered pixel units connected through corresponding data lines to the odd-numbered output channels, and the even-numbered pixel units connected through corresponding data lines to the even-numbered output channels;

the timing controller providing a strobe enabling signal and an odd-even selection signal, the odd-even channel selection module controlling the logic circuit and driver module to select strobe only odd-numbered output channels, strobe only even-numbered output channels, or strobe both odd-numbered and even-numbered output channels;

wherein the odd-even selection signal switches between a high level and a low level, with a switching period of one frame; and wherein when the strobe enabling signal is at high level, the odd-even selection signal is at low level, only the odd-numbered output channels are strobed, and the even-numbered output channels output 0 grayscale voltage;

when the strobe enabling signal is at high level, the odd-even selection signal is at high level, only the even-numbered output channels are strobed, and the odd-numbered output channels output 0 grayscale voltage; and when the strobe enabling signal is at low level, both the odd-numbered output channels and the even-numbered output channels are strobed.

2. The OLED display as claimed in claim 1, wherein the gate driver comprises a plurality of scan signal output channels, with each scan signal output channel connected through a scan line to a corresponding column of pixel units.

3. The OLED display as claimed in claim 2, wherein the adjacent pixel units in all four directions, including upward, downward, leftward, and rightward directions, to each odd-number pixel unit are all even-numbered pixel units;

the odd-numbered pixel units of the same row of pixel units are connected through a data line disposed at a side of the row of pixel units to an odd-number output channel; the even-numbered pixel units of the same row of pixel units are connected through a data line disposed at the other side of the row of pixel units to an even-number output channel.

4. The OLED display as claimed in claim 2, wherein the pixel units of an odd-numbered row of pixel units are all odd-numbered pixel units, the pixel units of an even-numbered row of pixel units are all even-numbered pixel units, each pixel unit of odd-numbered row is connected through a data line to an odd-number output channel, and each pixel unit of even-numbered row is connected through a data line to an even-number output channel.

5. The OLED display as claimed in claim 1, wherein the data receiving module receives data signals and provides to the logic circuit and driver module, the logic circuit and driver module provides the data signals to the corresponding pixel units in accordance with the controlling of the strobe output channels by the odd-even selection module.

6. A source driver, which comprises: a logic circuit and driver module, a data receiving module connected to the logic circuit and driver module, an even-odd channel selection module connected to the logic circuit and driver module, a plurality of odd-numbered output channels connected to the logic circuit and driver module, and a plurality of even-numbered output channels connected to the logic circuit and driver module;

the odd-even channel selection module receiving a strobe enabling signal and an odd-even selection signal, the odd-even channel selection module controlling the logic circuit and driver module to select strobe only odd-numbered output channels, strobe only even-numbered output channels, or strobe both odd-numbered and even-numbered output channels;

wherein the odd-even selection signal switches between a high level and a low level, with a switching period of one frame; and wherein when the strobe enabling signal is at high level, the odd-even selection signal is at low level, only the odd-numbered output channels are strobed, and the even-numbered output channels output 0 grayscale voltage;

when the strobe enabling signal is at high level, the odd-even selection signal is at high level, only the even-numbered output channels are strobed, and the odd-numbered output channels output 0 grayscale voltage; and when the strobe enabling signal is at low level, both the odd-numbered output channels and the even-numbered output channels are strobed.

7. An organic light-emitting diode (OLED) display, which comprises: a timing controller, a gate driver connected to the timing controller, a source driver connected to the timing controller, and an OLED panel connected to the gate driver and the source driver;

the source driver comprising: a logic circuit and driver module, a data receiving module connected to the logic circuit and driver module, an even-odd channel selection module connected to the logic circuit and driver module, a plurality of odd-numbered output channels connected to the logic circuit and driver module, and a plurality of even-numbered output channels connected to the logic circuit and driver module;

the OLED panel comprising a plurality of pixel units arranged in an array form, the pixel units divided into odd-numbered pixel units and even-numbered pixel units, the odd-numbered pixel units connected through corresponding data lines to the odd-numbered output channels, and the even-numbered pixel units connected through corresponding data lines to the even-numbered output channels;

the timing controller providing a strobe enabling signal and an odd-even selection signal, the odd-even channel selection module controlling the logic circuit and driver module to select strobe only odd-numbered output channels, strobe only even-numbered output channels, or strobe both odd-numbered and even-numbered output channels;

wherein the gate driver comprising a plurality of scan signal output channels, with each scan; signal output channel connected through a scan line to a corresponding column of pixel units;

wherein the odd-even selection signal switches between a high level and a low level, with a switching period of one frame;

wherein the data receiving module receives data signals and provides to the logic circuit and driver module, the logic circuit and driver module provides the data signals to the corresponding pixel units in accordance with the controlling of the strobe output channels by the odd-even selection module; and wherein when the strobe enabling signal is at high level, the odd-even selection signal is at low level, only the odd-numbered output channels are strobed, and the even-numbered output channels output 0 grayscale voltage;

when the strobe enabling signal is at high level, the odd-even selection signal is at high level, only the even-numbered output channels are strobed, and the odd-numbered output channels output 0 grayscale voltage; and when the strobe enabling signal is at low level, both the odd-numbered output channels and the even-numbered output channels are strobed.

8. The OLED display as claimed in claim 7, wherein the adjacent pixel units in all four directions, including upward, downward, leftward, and rightward directions, to each odd-number pixel unit are all even-numbered pixel units;

the odd-numbered pixel units of the same row of pixel units are connected through a data line disposed at a side of the row of pixel units to an odd-number output channel; the even-numbered pixel units of the same row of pixel units are connected through a data line disposed at the other side of the row of pixel units to an even-number output channel.

9. The OLED display as claimed in claim 7, wherein the pixel units of an odd-numbered row of pixel units are all odd-numbered pixel units, the pixel units of an even-numbered row of pixel units are all even-numbered pixel units, each pixel unit of odd-numbered row is connected through a data line to an odd-number output channel, and each pixel unit of even-numbered row is connected through a data line to an even-number output channel.

* * * * *